United States Patent
Wong et al.

(10) Patent No.: US 6,265,925 B1
(45) Date of Patent: Jul. 24, 2001

(54) MULTI-STAGE TECHNIQUES FOR ACCURATE SHUTOFF OF CIRCUIT

(75) Inventors: Keng L. Wong, Portland; Hung-Piao Ma, Hillsboro, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/408,566

(22) Filed: Sep. 30, 1999

(51) Int. Cl.$^7$ .................................................. H03L 5/00
(52) U.S. Cl. ............................................ 327/308; 327/566
(58) Field of Search .................................. 327/308, 530, 327/564, 565, 566

(56) References Cited

U.S. PATENT DOCUMENTS

| | | | |
|---|---|---|---|
| 4,158,786 | * | 6/1979 | Hirasawa .............................. 327/437 |
| 4,529,890 | * | 7/1985 | Kobayashi et al. .................. 327/427 |
| 5,012,123 | * | 4/1991 | Ayasli et al. ......................... 327/427 |
| 5,623,222 | * | 4/1997 | Tamagawa ............................ 327/47 |

OTHER PUBLICATIONS

Dieter K. Schroder, "Modular Series on Solid State Devices", *Advanced MOS Devices*, Neudeck & Pierret, Editors (1987), pp. 208–212.

* cited by examiner

*Primary Examiner*—Kenneth B. Wells
(74) *Attorney, Agent, or Firm*—Antonelli, Terry, Stout & Kraus, LLP

(57) ABSTRACT

A multi-stage assembly is disclosed, including a plurality of stages successively arranged, each having a controllable circuit portion and a controlling switching portion coupled thereto. The controlling switching portions have one or more ON/OFF switches which can be MOS transistors, CMOS circuits, etc. A first end of each ON/OFF switch of each controlling switching portion is coupled to a separate node of the controllable circuit portion of that stage and, also, is coupled, respectively, to a second end of a corresponding switch in an adjacent succeeding stage thereby to form selectively actuated one or more strings of series-coupled ON/OFF switches. All switches in an individual string being substantially simultaneously either turned ON or turned OFF. In one such disclosed application, although not limited thereto, the multi-stage assembly features a multi-stage reconfigurable impedance network or, for that matter, a low current/low power biasing network or analog circuit including a cascade arrangement of duplicate circuits in a manner which reduces errors in the output resulting from leakage currents in the turned OFF transistor switches. The number of stages employed, which can be expanded to take into account future scale-downs, also, are based on the level of reduction of subthreshold conduction needed to conform to the error reduction requirements of the circuitry.

31 Claims, 4 Drawing Sheets

MULTI-STAGE TECHNIQUES FOR ACCURATE SHUTOFF OF CIRCUIT

FIELD

The present invention relates, generally, to the field of reconfigurable circuits and, more particularly, to any type of switchably reconfigurable low-bias circuit which operates on either DC or AC.

BACKGROUND

In recent years, the scaling down of the sizes of active elements in semiconductor integrated circuits (ICs) has led to repeated significant increases in the level of integration of an IC chip, as well as compactness thereof. Correspondingly, the supply voltages of ICs, as well as voltage/current levels assigned to logic levels for operating integrated circuits have also been scaled down considerably. One reason for this is that parasitic resistances and capacitors associated with the signal lines have been significantly lowered as lengths of signal lines in ICs have been reduced and electrical isolation improved. With the scaling down of the active elements such as switching transistors, including, for example, a MOS transistor, a CMOS circuit, etc., the threshold voltage (Vt) associated with such switching transistors has been correspondingly scaled down also, thereby permitting the use of lower and lower logic voltage levels for switching ON and OFF the transistors.

Threshold voltages play an important role in the performance of low-voltage/low-power circuits. For example, conventionally, in order to achieve optimal performance in low voltage analog circuits, the threshold voltages and logic signal differentials would necessarily be adjusted with high accuracy, typically, in an upward direction to avoid the subthreshold region operation. However, this would be contrary to the efforts of scaling down of ICs. The phenomenon of subthreshold conduction (i.e., leakage) per se in MOSFETs has been known for some time and discussed on pages 210–212 in the text entitled *Advanced MOS Devices* by D. K. Schroeder, published 1987 by Addition-Wesley Publishing Co. As logic levels have continued to be lowered, what was considered as previously negligible leakage current levels in connection with higher threshold switching schemes now plays a significant role, the inventors found, in the operation of low voltage circuits. This is especially true in reconfigurable low-bias circuits, for example, deep submicron low power switching circuits including programmable low-bias impedance circuits which may be used as a common network in analog circuits such as an ADC (Analog-to-Digital Converter) and DAC (Digital-to-Analog Converter), although not limited thereto.

The present inventors, in their investigative efforts of, for example, low-bias voltage analog circuits, have examined the phenomenon of leakage currents during the OFF-state of switching transistors, such as MOS (metal-oxide semiconductor) transistor switches or CMOS (complementary metal-oxide semiconductor) circuit switches and how they can affect the integrity of the operation of the circuits and thereby cause errors in the output. That is, when Vt is scaled down to very low levels, a degradation associated with the subthreshold characteristics develops. Such degraded subthreshold characteristics leads to an increase in the leakage current. In fact, such subthreshold leakage current, even at zero gate bias (Vgs=0), can result in appreciable signal leakage in, for example, analog circuits. In other words, this current leakage problem during the OFF-state of switching MOS/CMOS transistors, etc., puts, in effect, a limit for Vt scale-down, as well as a limit with regard to scaling down even further the low and high voltage levels associated with the switching operation of transistors and, correspondingly also, the low boundary of the supply voltage (signal levels) associated with the low-voltage circuits. (A MOSFET refers to a metal-oxide-semiconductor field-effect transistor, an IGFET, which is generically inclusive of a MOSFET, refers to an insulated-gate field-effect transistor, and a CMOS circuit refers to a pair of complementary MOSFETs, including, for example, where the p- and n-channel MOSFETs are in parallel connection like a CMOS transmission gate with the gates thereof receiving complementary signals such as through an inverter.) Occurrence of leakage current in the subthreshold region, for example, in which Vgs<Vt for a MOS transistor (e.g., a MOSFET or, generically, a MISFET [metal-insulator-semiconductor field-effect transistor]), significantly increases when the supply voltage (e.g., Vdd) and the threshold voltage Vt are scaled down even further and the ON current/OFF current ratio becomes degraded, also. A reduced Vt increases occurrence of leakage currents during the off-state of MISFETs. Moreover, the scaling down of the device size for the constant threshold also increases the leakage current. In consideration of achieving improved results in the design of low bias current (low power) circuits, the present inventors have considered the criteria of subthreshold conduction, also.

SUMMARY

A multi-stage assembly, has a plurality of stages which are successively arranged, beginning with the first stage and in which and ending with the final stage, each stage includes a controllable circuit portion and a controlling switching portion coupled thereto. In the multi-stage assembly, the controlling switching portions of all stages have one or more ON/OFF switches. A first end of each ON/OFF switch of each controlling switching portion of the assembly is coupled to a separate node of the controllable circuit portion of a corresponding stage and, also, being coupled, respectively, to a second end of a corresponding switch in an adjacent succeeding stage thereby to form selectively actuated one or more strings of series-coupled ON/OFF switches. All switches in an individual string are ON and OFF substantially simultaneously.

BRIEF DESCRIPTION OF THE DRAWINGS

The foregoing and a better understanding of the present invention will become apparent from the following detailed description of the illustrated embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and is not limited thereto. The spirit and scope of the present invention are limited only by the terms of the appended claims.

The following represents brief descriptions of the drawings, wherein.

DETAILED DESCRIPTION

Figure 1:
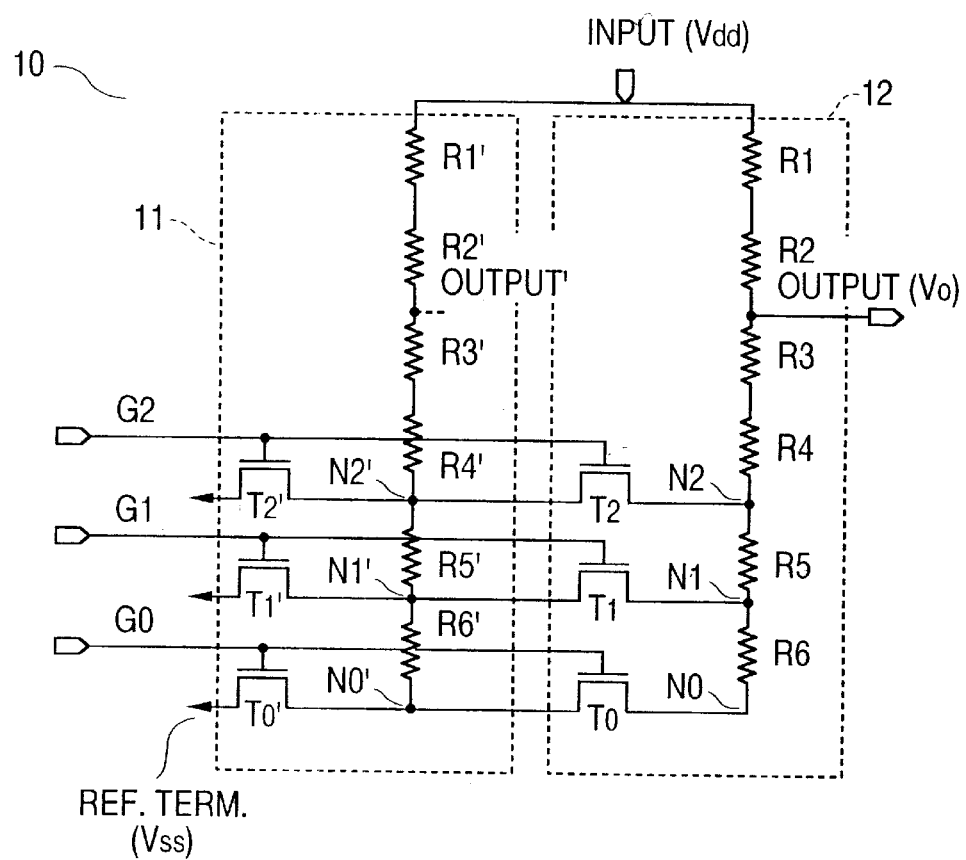
FIG. 1 is a programmable resistor ladder according to a first embodiment of a multi-stage assembly of the present invention.

In the Detailed Description of the disclosed embodiments, in terms of relating the same to the present invention, it should be noted that like reference numerals/characters in different drawing illustrations are used to designate identical, corresponding or similar components. Further, the drawing illustrations are not drawn to scale and, also, well-known power connections, as well as other circuit components, which are connectable to the embodiments illustrated, are not all shown within FIGS. 1–7 for simplicity of illustration and discussion, and so as not to obscure the invention. In this connection, an example of biasing of the body B (substrate or well region) of the illustrated IGFETs, e.g., MOS transistors, is only shown in FIG. 4 of the drawings for simplicity of illustration and discussion and, also, so as not to obscure the invention.

When applying the present invention to low bias current (low power) circuits which are switchably reconfigurable, it is imperative that the OFF devices (e.g., transistor switches) during operation of those circuits do not draw appreciable current thereby to achieve a level of operation which is considerably more error free than that previously obtainable. In this connection, FIG. 1 shows one such application of the invention through effecting a cascade connection of an existing circuit with a duplicate circuit in a manner which reduces error in the output. More particularly, FIG. 1 features a programmable resistor ladder 10 according to a first embodiment of a multi-stage assembly of the present invention. That is, two stages, namely, resistor ladder stage 11 and resistor ladder stage 12, are coupled in succession such that there is effected a substantial reduction in the turn-OFF leakage current associated with the switching transistors $T_0$, $T_1$ and $T_2$ of the second or final stage 12 of the assembly. In order to appreciate this reduction of leakage current during the turn-OFF state of the switching transistors, discussion will turn to FIG. 7 of the drawings which shows an example of a programmable resistor ladder using a parallel arrangement of MOS transistors examined by the present inventors.

Figure 7:
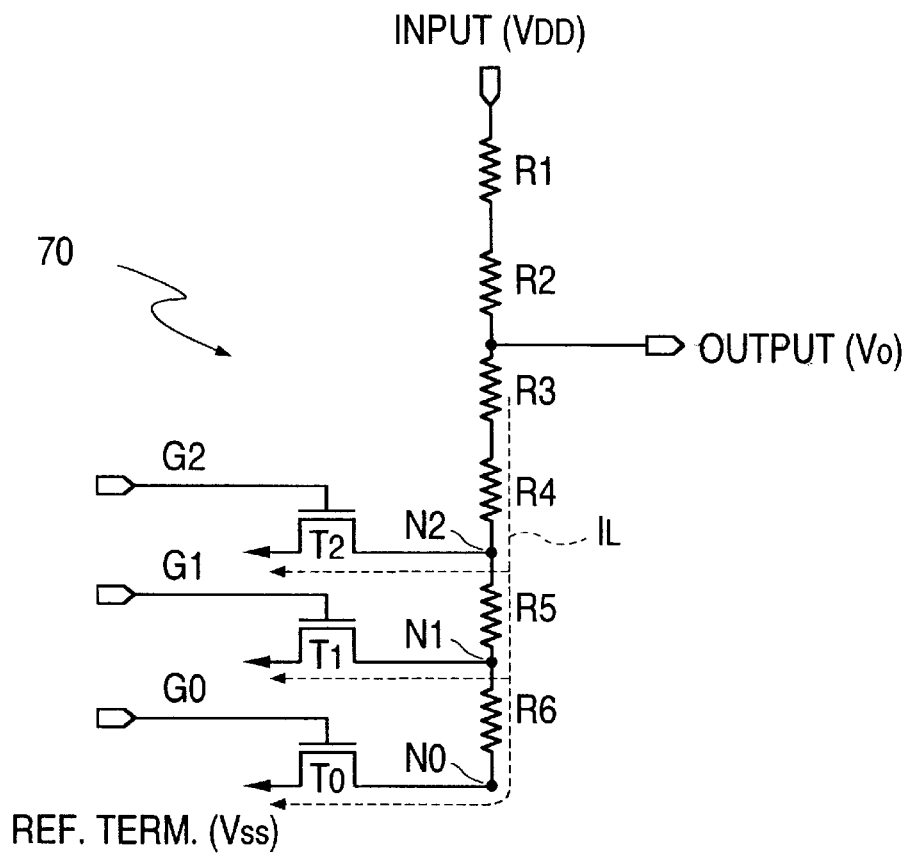
FIG. 7 is an example of a programmable resistor ladder using a parallel arrangement of MOS transistors.

In the programmable resistor ladder 70 shown in FIG. 7, the output voltage $V_0$ is programmably controllable through selective actuation of switching transistors $T_0$, $T_1$ and $T_2$. Turning ON different ones of the switches can vary the length of the resistor ladder and thus programmably control the output voltage level. For example, if $T_2$ is turned on, node N2 is effectively grounded through the drain-source current path of MOS transistor $T_2$. Of course, in order to effect such programmability in the voltage division of the resistor ladder, it is imperative that the ON resistance of each of the MOS transistors is much lower than the resistor segment(s) being bypassed by that MOS transistor, while the OFF resistance of each MOS transistor must be significantly higher than the bypassing resistor segment(s) corresponding to that MOS transistor. That is, the ratio between the ON/OFF current characteristics of the MOS transistors must be high. However, as discussed earlier, in todays processes, the ON/OFF current ratio has degraded, in fact, exponentially over each new generation of semiconductor technology process development which has led to the scaling down of the power requirements (e.g., Vdd) and the threshold voltage (Vt), along with the scaling down of the size of, for example, MOS transistor and CMOS circuit switches. That is, with smaller featured processes, there has correspondingly resulted in an increase in OFF-state leakage current which makes it difficult to turn the transistor OFF completely, thereby impeding reconfigurability, especially of low bias analog circuits.

In the past, where the power requirements were substantially higher and, also, the size of the transistor elements were also substantially greater, one way to minimize the effect of the turn-OFF currents in, for example, MOS transistors and the like was to use higher level voltage and current requirements, as well as raise the threshold voltages of the transistor switches. However, this works against the recent developments toward miniaturization, as well as goes against any future developments towards achieving a greater degree of integration through effecting a further scale down of active components, including that of FETs (inclusive of MOS transistors and CMOS circuits, etc.), scaling down of the ICs per se as well as of the power/current requirements therefor. Also, higher voltages would mean greater amounts of heat to be dissipated. Therefore, as IC chips are becoming more dense and smaller, it becomes harder and harder to dissipate the heat therefrom.

Turning back to the investigated example in FIG. 7 of the drawings, gate inputs G2, G1 and G0 refer to programming signals which determine the output voltage of the resistor ladder as a division function of the input which can be a DC supply (e.g., Vdd) or an AC signal, for that matter. A MOS transistor switch such as NMOS transistor $T_2$ is in an ON state when the gate input G2 is at a voltage level higher than the threshold voltage Vt of that transistor. The gate signal G2 is lowered to an OFF signal level, namely, when the input Vgs (gate-source voltage) of the NMOS transistor T2 is equal to 0 volts. However, leakage current through a supposedly OFF transistor switch has been found to actually be present, thereby resulting in an error at the output voltage, e.g., an erroneous output signal. This error is especially severe if there are many such parallel disposed transistor switches in the network, and if the bias level of the network is low. Assume that transistors $T_0$–$T_2$ are all in an OFF state, but, however, subthreshold leakage currents are occurring therefrom even at a voltage bias at Vgs=0. Assume, also, for example, that a voltage of 0.5 volts appears at node N2. Since the source of the MOS transistor is at ground potential, a voltage Vds (drain-source voltage) of 0.5V appears across the drain-source of that transistor and contributes in allowing the leakage current to occur. In fact, as the current/power requirements of such circuits and, for that matter, of all low power circuits are scaled down even further, the dependency of leakage currents in the subthreshold region, including at a gate bias of Vgs=0, on the drain-source voltage Vds becomes quite significant. This is especially noticeable as the Vds values are being reduced to 0.3V or lower for Vt @ 0.5V or lower. For Vds values that are substantially greater than that amount, leakage currents may be present, but, however, they are substantially unaffected by changes in Vds, the present inventors observed. In other words, the problem of leakage currents which occurs during the OFF state of the switching transistors has a greater and greater impact as the power requirements are scaled down more and more. As it relates to the example in FIG. 7, even if all of the transistor switches $T_0$–$T_2$ are OFF, there is still a considerable voltage differential Vds across each drain-source current path which results in leakage currents (designated by dashed currents $I_L$) to flow through those transistors and thus, also, through the resistor ladder. In a scheme such as this, which may necessarily require scale-down voltage levels to represent the logic levels, the currents of such subthreshold leakage currents would induce a voltage at the output terminal which would erroneously be recognized as a valid output.

Applicants have recognized this dependency of the turn OFF leakage current on the drain-source voltage Vds of the MOS transistor and CMOS circuit switches, when gate bias Vgs=0, especially, at scale-down operating current/voltage levels. Accordingly, in consideration of this dependency of the turn OFF leakage current on Vds for small values of Vds, the present inventors have attempted to devise a scheme by which the leakage current can be significantly lowered, if not removed completely, through a lowering of the drain-source voltage in the OFF state of the switching transistors to a level as close to 0 as practically acceptable. In this connection, the multi-stage programmable resistor ladder shown in FIG. 1 of the drawings has been achieved as one example of the present invention.

As illustrated in FIG. 1 of the drawings, stage 11 can be considered as somewhat similar to the example in FIG. 7 of the drawings. In this connection, initial stage 11 can be considered as the "shadow" stage (shadow ladder circuit/shadow ladder network), while final stage 12 can be considered as the added ladder circuit/added ladder network. Through effecting a multi-stage assembly such as that shown in FIG. 1 of the drawings, the voltage drop, namely, Vds, across the drain-source of all of the transistor switches in the stage 12 becomes significantly reduced from that in stage 11. That is, the Vds values of switches $T_0'$–$T_2'$ in the initial or "shadow" stage 11 are substantially higher than those of the corresponding transistor switches $T_0$–$T_2$ in the final stage 12, respectively. Accordingly, with a significant drop in the turn-OFF Vds voltages of the transistor switches $T_0$–$T_2$ in the final stage 12 to values which are substantially close to 0V, the OFF leakage current, $I_{OFF}$, of each transistor switch becomes close to 0, thereby effectively eliminating, for all practical purposes, or at least significantly reducing, the developing of errors in the programmably controllable output voltage. As an example of this, the following brief description, as it relates to the FIG. 1 embodiment, is given.

The switching operation associated with the reconfigurability of the resistor ladder network in terms of programmably altering the impedance and, therefore, the output voltage $V_0$ at the terminal "output" is effected under the control of the common gate inputs G0, G1, and G2. With respect to the final stage, each of the MOS transistor switches $T_0$–$T_2$ experiences a substantially smaller source-drain voltage in the OFF state than those associated with a corresponding such MOS transistor switch in the preceding or "shadow" stage. Assuming that the drain voltages of MOS transistor switches $T_0$, $T_1$ and $T_2$ at nodes N0, N1 and N2 in the final circuit stage 12 have voltages of 0.3V, 0.4V and 0.5V, respectively, and that the drain voltages of transistor switches $T_0$, $T_1$, and $T_2$, corresponding to nodes N0', N1' and N2' in the shadow circuit 11, are 0.25V, 0.35V and 0.45V, respectively, a significant drop is noted in the turn OFF Vds of switching transistors which are in the final stage from those which are in the "shadow" stage. For example, while the Vds during turn-OFF of transistor switch $T_2'$ in the "shadow" stage 11 is at 0.45V (i.e., 0.45V–0V=0.45V), the turn-OFF Vds of the corresponding transistor switch $T_2$ in the final stage 12 is 0.05V (i.e., 0.5V–0.45V=0.05V), which is approximately 1/10th the Vds of the example in FIG. 1. Such lowering of the turn-OFF drain-source voltage Vds of MOS transistor $T_2$ over that of MOS transistor $T_2'$ contributes heavily to the reduction in the subthreshold leakage current of MOS transistor $T_2$ and thereby leads to a considerably more accurate output voltage $V_0$. Said differently, the turn-OFF Vds values of the transistor switches in the final circuit stage are considerably reduced over the turn-OFF Vds values of the corresponding transistor switches in the first or "shadow" stage since the ladder resistor network nodes N0', N1' and N2' of the first or "shadow" circuit stage are almost equal to that of the resistor ladder network nodes N0, N1 and N2 in the final circuit stage, respectively.

Even though the Vds may not be completely reduced to 0 (which would correspond to 0 drain current), the leakage current is considerably reduced in view of the substantial reduction in the Vds associated with each of the transistor switches in the final circuit stage over corresponding ones in the preceding "shadow" stage. That is, because the OFF-state Vds values associated with the final circuit stage are very small, leakage currents through the corresponding switches are also reduced in a like manner in view of the dependence of the turn-OFF leakage current to the Vds values for low values of Vds. An error is still inherently present at the output V0 of the multi-stage resistor ladder network. However, this error is of the second order, noting that the network is composed of a pair of successively coupled duplicate stages. (The error of the first order is associated with the original circuit in FIG. 7, in this example.) Therefore, if the error in the original circuit due to leakage currents at Vgs=0V is at 10%, for example, the error according to the first embodiment, in FIG. 1, would be reduced to 1%, for example. This relationship can be expressed as $(error)^2$, for example, as it relates to the embodiment in FIG. 1 of a two-stage assembly.

The following phenomena associated with the invention as it relates to the example in FIG. 1 of the drawings also needs to be discussed since they primarily effect the reduction in the leakage current during the turn-OFF state of the switching transistors.

Basically, three main factors are prevalent in the reduction of the turn-OFF leakage current associated with a resistor ladder assembly such as shown in FIG. 1 of the drawings. At first, the inventors considered the reduction of the leakage current was provided solely by the lowering of the effective OFF state Vds across the final stage transistors, as discussed earlier. However, the inventors subsequently realized that a second phenomenon was occurring which contributed to the lowering of the leakage current to an even greater degree. Namely, with the addition of a duplicate stage in connection with reducing the drain/source differential and thereby, correspondingly, reducing the OFF -state leakage currents, the gate source voltages of all of the transistor switches in the final circuit stage had become, effectively, lowered to a negative Vgs value. For example, when all of the NMOS transistors are turned OFF, G2, G1 and G0 are at 0V, the first or "shadow" stage nodes N2', N1' and N0' (which correspond also to the source voltages of $T_2$, $T_1$ and $T_0$, respectively, of the final stage) are at 0.45V, 0.35V and 0.25V, respectively, and the gate to-source voltages Vgs associated with MOS transistors $T_2$, $T_1$ and $T_0$ of the final stage 12, it is observed, are at –0.45V, –0.35V and –0.25V, respectively. Such a pull of the gate-to-source voltage Vgs in a negative direction, for example, in NMOS transistors of the final stage has, effectively, a significant reducing effect in the leakage currents of those transistors. This reducing effect is even more prominent when additional such stages are cascaded in succession. In that case, the error resulting from leakage current can be reduced to the Nth order, where N represents the number of such stages. In this case, the Vds would also be reduced by one additional order with each successively added stage.

Figure 8A:
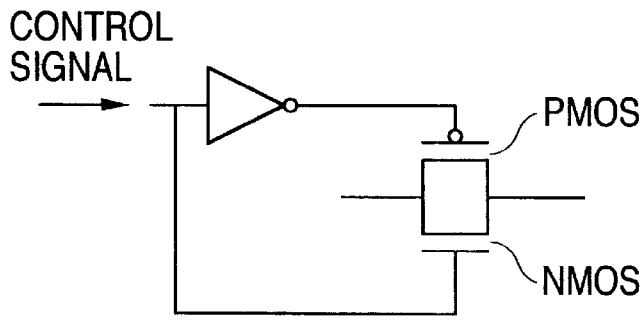
FIGS. 8A and 8B are examples of conventional CMOS circuits which can also be used to form ON/OFF switches.
Figure 8B:
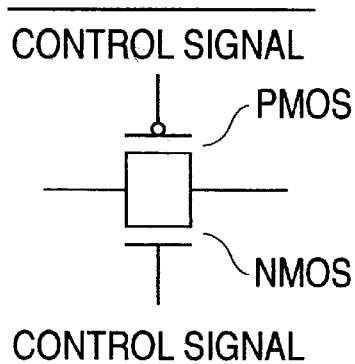

A third phenomenon influencing the reduction of the OFF-state leakage current pertains to the body effect phenomenon. For n-channel MOSFETS, the body refers to a p-well region or p-substrate which has formed therein the n-type source and drain regions. For a p-channel MOSFET, the body refers to the n-well or n-type substrate which has the p-type source and drain regions formed therein. The body effect is associated with a characteristic shifting in the threshold voltage resulting from a bias supplied to the well region or substrate, in the case of MOS transistors or CMOS circuits, for example. As it relates to the programmable resistor ladder in the first embodiment shown in FIG. 1, since all of the NMOS transistors have substrates (or, alternatively, well regions) which are grounded, it is noted that the biasings across the source-substrate (or, alternatively, source-well region) in the NMOS transistors $T_0$–$T_2$ are negative, which leads to an increase in the effective threshold voltage of those transistors. In fact, it is noted, this reverse bias across the source-substrate (or across the source-well region) of transistor $T_1$ is greater than that of transistor $T_0$ and that of transistor $T_2$ is greater than that of transistor $T_0$. It can be said, therefore, that the leakage current of transistor $T_1$ is reduced by a greater amount than that of transistor $T_0$ and, moreover, the leakage current of switching transistor $T_2$ is reduced by a greater amount than that of transistor $T_1$. Even without the advantages of the body effect, the reduction in the OFF-state leakage currents resulting from a substantial lowering of the source-drain voltage Vds, as well as the realizing of a negative gate-to-source voltage Vgs would still be significant. Therefore, while it is preferred that all of the well regions or common substrate associated with the NMOS transistors with regard to FIG. 1 are biased at ground potential, or, generally, at the common source potential of the MOS transistors of the first "shadow" stage, the invention would also work with the source regions of the respective transistors coupled to the substrate (or well) regions thereof. It should also be understood that, while the transistor switches in stages 11 and 12 of FIG. 1 have been discussed in terms of NMOS transistors (n-channel MOSFETS or n-channel MISFETS), this discussion is applicable, in fact, to transistor switches in general, including but not necessarily limited to n-channel/p-channel FETs such as PMOS/NMOS transistors, CMOS circuits (inclusive of CMOS transmission gates), etc. Examples of CMOS circuits applicable herein are shown in FIGS. 8A and 8B.

Figure 2:
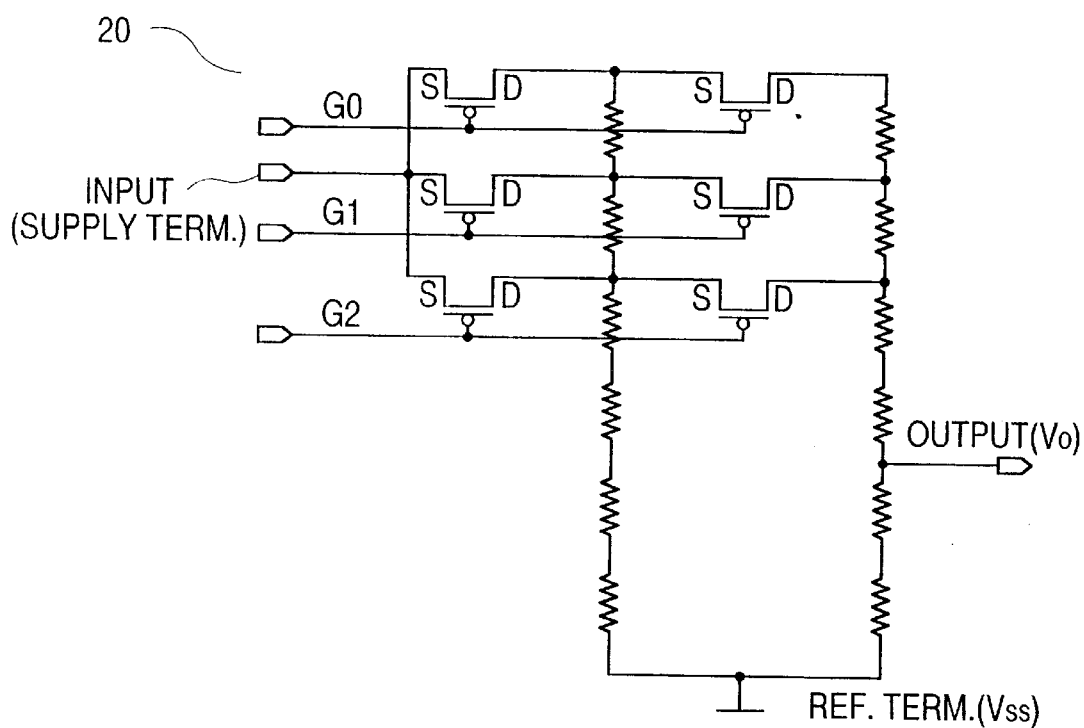
FIG. 2 is a programmable resistor ladder according to a second embodiment of a multi-stage assembly of the present invention.

FIG. 2 shows another embodiment 20, as it relates to a further example of the present invention, in which PMOS transistors (e.g., p-channel MISFETS/MOSFETS) are being used instead (although not limited thereto), in which case the biasing directions are reversely applied for ON/OFF control to that applied with regard to the FIG. 1 embodiment. Where a positive Vdd voltage is applied at the terminal input (Supply Term.) and ground voltage is applied at the reference terminal (Ref Term.), the convention for the source and drain of the PMOS transistors is as shown. The examples shown in FIGS. 1 and 2 of the drawings are also applicable to impedance ladder networks per se, such as illustrated in FIG. 3 of the drawings.

Figure 3:
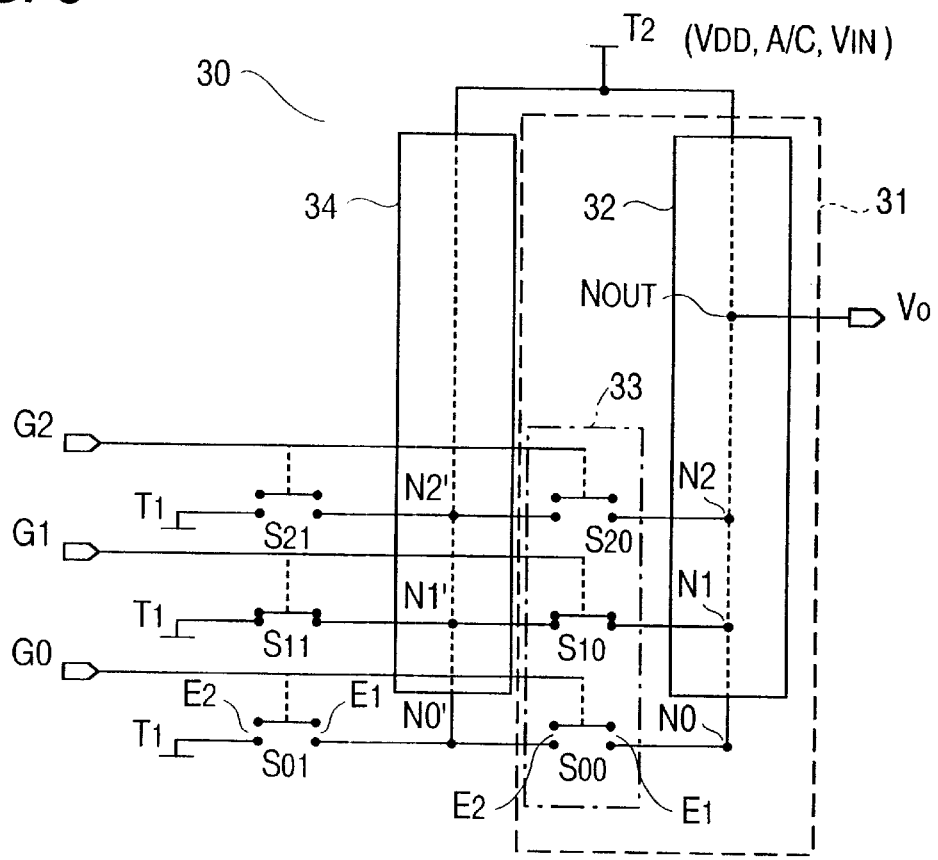
FIG. 3 is a third embodiment of a multi-stage assembly according to the present invention.

Specifically, in FIG. 3 of the drawings, 30 represents a multi-stage reconfigurable circuit which can be, although not limited thereto, a programmable resistor ladder such as depicted in FIGS. 1 and 2 of the drawings, or, alternatively, a multi-stage circuit arrangement such as a multi-stage biasing network for an analog circuit which has switchability. Such circuit or arrangement, for example, employs similarly disposed controlling switching portions arranged such that an error in the output V0 due to leakage current flow, during OFF states of the switching transistors, is considerably reduced to a level which is, for all practical purposes, negligible. Such reduction in error can be improved to the Nth order, namely, error$^N$, where N represents the number of successively arranged stages in the assembly. This, of course, will depend on the immediate needs of the circuit to be used, including, for example, the low-bias/power requirements, as well as the level of integration to which the low biasing circuitry is to be scaled down to. With regard to FIG. 3 of the drawings, a final stage 31 of the circuit network or assembly is reflective of a similar such arrangement with regard to a preceding stage. As an example, the final stage is composed of a controllable circuit portion 32 which can be a resistor ladder or impedance ladder network or, for that matter, any low power biasing network which can be constituted by either passive or active component elements or, alternatively, a combination of both. In all instances, the multi-stage assembly is controllably reconfigurable through ON/OFF control of the switches associated with each stage. With regard to the controlling switching portion 33, in the final stage 31, switches $S_{00}$, $S_{10}$ and $S_{20}$ are included therein. In like manner, switches $S_{01}$, $S_{11}$ and $S_{21}$ are disclosed with regard to the preceding "shadow" stage which also includes a controllable portion 34, disposed in a similar fashion as that of controllable portion 32 of the final stage 31. E1 and E2 in FIG. 3 represent the first and second ends (or first and second contacts) associated with each of the switches and, with regard to this, it is noted, also, similarly disposed switches in respectively different controlling switching portions are series-coupled so as to form individual strings of series-coupled ON/OFF switches in a manner in which all of the switches in each individual string may be, for example, substantially simultaneously either turned ON or turned OFF. In this example, to achieve this, all ON/OFF switches along the same string are commonly coupled to the same gate signal G0, G1 or G2, although not limited thereto. In fact, this technique can be applied in a cascaded fashion to further reduce the error to the 3rd, 4th, etc., order, in a scheme such as shown in FIG. 3 or, for that matter, to any such circuit and, especially, to any reconfigurable low-bias analog circuit which operates under DC power or, for that matter, under AC power. This technique is especially advantageous for achieving accurate shutoff in deep sub-micron low power circuits.

Figure 4:
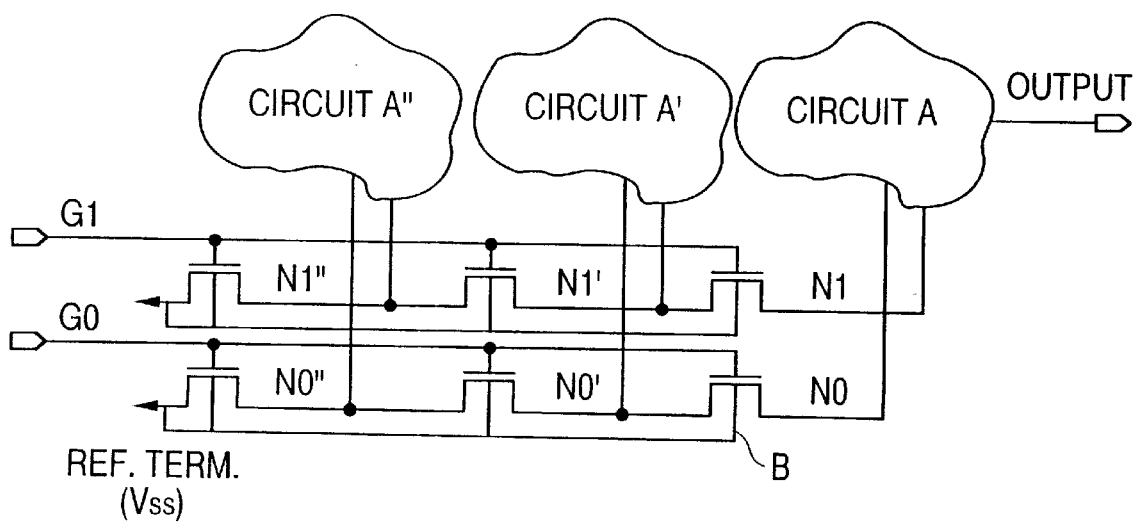
FIG. 4 is a fourth embodiment of a multi-stage assembly according to the present invention.

With regard to the FIG. 4 embodiment, which is another example of application of the present invention, three successive stages of FET switches are employed, thereby effecting two series strings of ON/OFF FET switches which can be, for example, enhancement/depletion mode NMOS or PMOS transistors or, for that matter, CMOS circuits. In this illustration, the substrate (or well region) associated with all of the switches is commonly biased to the reference terminal. Also, each one of the three (3) sets of two ON/OFF transistor switches is assigned to a respective one of the three (3) controllable circuit portions included, namely, circuit A, circuit A' and circuit A", respectively. It is noted that the front end of each of the two (2) illustrated strings are coupled to different nodes of the controllable circuit portion or circuit A of the final stage and the two strings are coupled at the tail ends thereof to a first supply terminal Ref Term.), namely, ground potential or, alternatively, at another reference potential applicable to the biasing environment of the circuitry according to FIG. 4. When FIG. 4 is considered in light of the discussion with regard to FIGS. 1 and 2 of the drawings, the controllable circuit portions associated with all of the stages can be duplicate circuits; however, the invention should not be considered as being limited thereto. In fact, although the entirety of the stages can be duplicates of the final stage, or of the initial first stage, depending on which side is being viewed first, it is possible to employ circuitry associated with the controllable switching portions of different stages to be respectively different in terms of makeup and/or reconfigurability. Also, in such a case, outputs can be taken therefor, not only from the final stage, such as discussed with regard to FIGS. 1–3 but, also, outputs are available with regard to the controllable circuit portions associated with the other ones of the plural stages of the assembly, even with regard to circuits such as that shown in FIGS. 1–3 of the drawings, in which case those provided output levels would be available for use elsewhere, either within the same chip or applied elsewhere.

Figure 5:
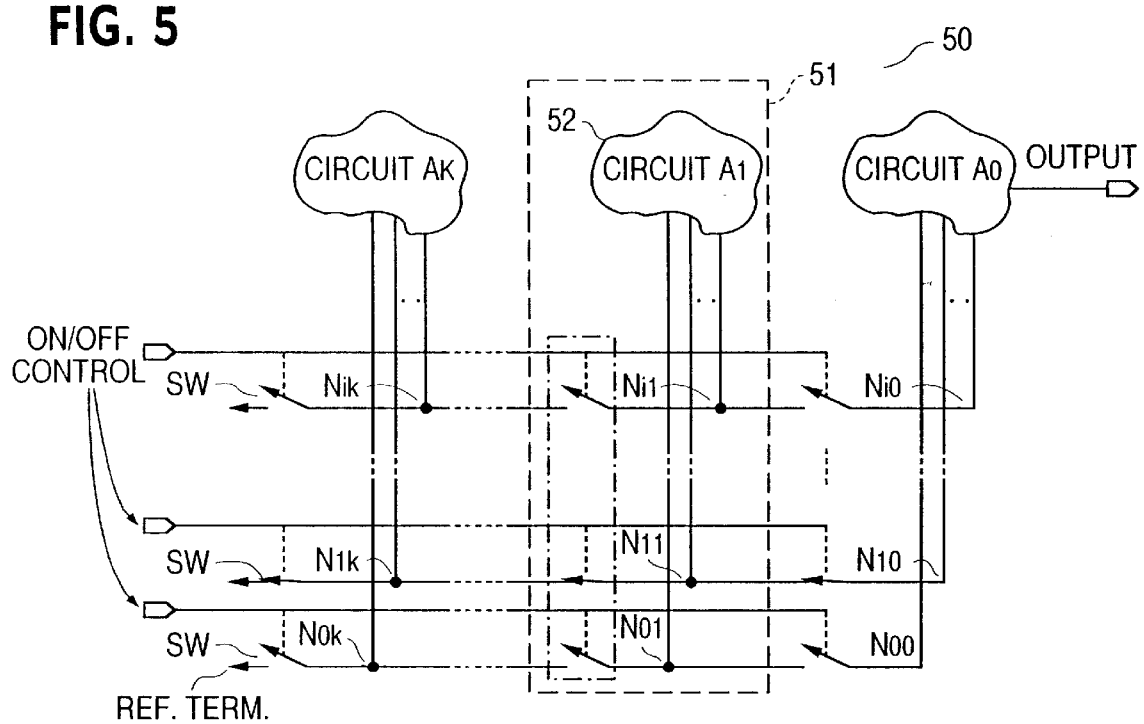
FIG. 5 is a fifth embodiment of a multi-stage assembly according to the present invention.

FIG. 5 is a schematic illustration of a fifth embodiment applying the present invention to a multi-stage circuit arrangement or assembly 50 that can be constituted by any number of stages, depending on the accuracy/sensitivity requirements of the circuitry including in terms of reconfigurability and application to low power circuit arrangements such as low power analog circuits, including with regard to ADC (analog-to-digital converters) and DAC (digital-to-analog converters), although not limited thereto. In FIG. 5 of the drawings, $N_{00}$ to $N_{jk}$ represent nodes of the circuits $A_0$, $A_1$, . . . Ak to which the individual switches of that stage are coupled. In this connection a next-to-last stage 51 comprises controllable circuit portion 52 and controlling switching portion 53. Each such stage similarly has a controllable portion, as well as a controlling switching portion. In FIG. 5 of the drawings, it is noted that the lowermost, as well as the uppermost, strings of switches SW are shown to be open, while the second string from the bottom is shown to be closed, that is, the switches of that string are considered to be ON (or turned ON). Although the controlling switching portions of the three shown stages, in the embodiment in FIG. 5 of the drawings, are shown to be similar to one another, the length of the strings should not necessarily be limited to that in which all the strings have the same number and same arrangement of switches. It is possible, depending on the circumstance, for the strings not to be, necessarily, of the same length. In that case, strings may have differing numbers of switches which are coupled in series. Under such circumstances, one or more of the controlling switching portions may have fewer switches than the remaining ones of the controlling switching portions.

Figure 6:
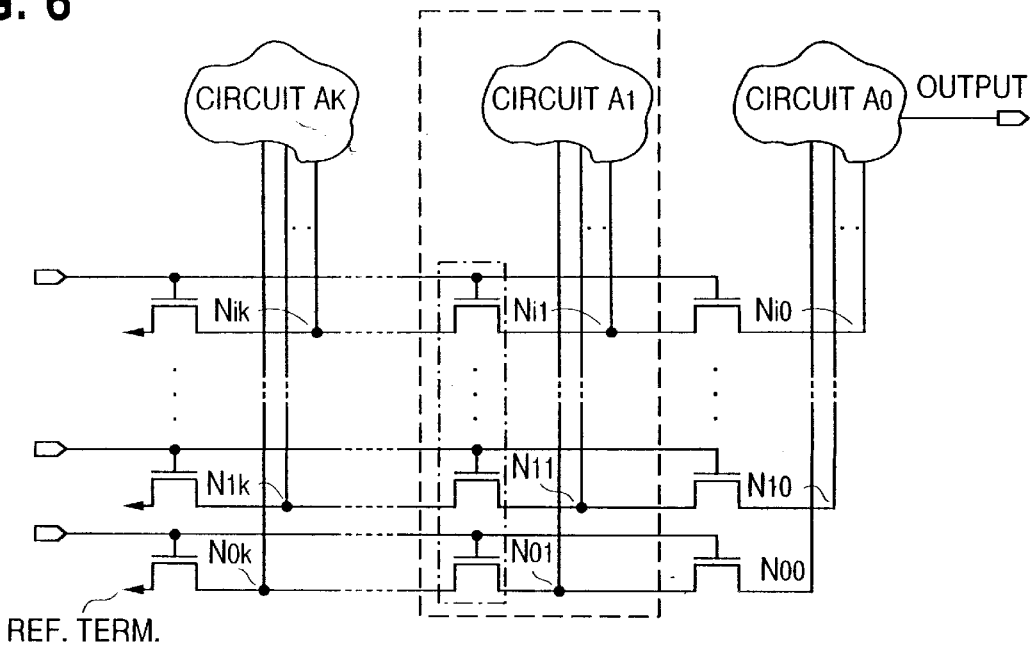
FIG. 6 is illustrative of the fifth embodiment using MOS transistors to form the ON/OFF switches of the controlling portions of all the stages.

FIG. 6 shows a multi-stage assembly corresponding to that in FIG. 5 using field effect transistors (FETS, IGFETs such as MOSFETS, and the like) as switches SW. In fact, the switches SW of the multi-stage assembly of FIG. 5 as well as other embodiments herein can be implemented with conventional CMOS circuits such as the CMOS transmission gates shown in FIGS. 8A and 8B, although not limited thereto In such a case, each string of CMOS transmission gates is coupled to receive a common control signal and a signal complement (logical invert) thereof Although the current transfer capabilities of all of the transistor switches can be the same, it might behoove the circuit designer, depending on application thereof, to employ transistor switches with current transfer capabilities (e.g., transconductances in FETs) which are increased as the successive distances thereof away from the final stage, along the individual strings of switches, is increased. Such can be effected, noting that those distanced transistors would necessarily have sufficient current capability to absorb more current than those provided in succeeding stages. Using the FIG. 1 embodiment of the present invention as an example, it is noted that the gating transistors $T_0$, $T_1$, and $T_2$, pertaining to the first shadow circuit stage, must necessarily handle both the current coming from the resistor ladder of the "shadow" stage 11, as well as that from the final stage 12, while transistors $T_0$, $T_1$ and $T_2$ only need to absorb the current from the final stage resistor ladder. Accordingly, the switching transistors pertaining to the first or "shadow" stage can be designed to have greater current transfer capability (e.g., greater W/L channel ratio for FETs) than that of the corresponding transistor switches of the final stage. However, all of the transistors can instead be designed to have the same transfer current capability as long as the current transfer capability during the ON time of the transistors is capable of handling the combined currents associated with all of the successively disposed stages.

During the ON cycle of the switching transistors, also, a larger current will necessarily flow through the transistor $T_2$, in FIG. 1, than through $T_1$ and, also, a larger current will flow through $T_1$ than through $T_0$, with regard to the final stage, and, similarly, a larger current flows through $T_2'$ than through $T_1'$ and, also, a larger current will flow through $T_1'$ than through $T_0'$, in the "shadow" stage. Therefore, the sizes of the transistors in terms of the current transfer capabilities thereof can also be determined such that transistor switches which are positioned successively higher, starting from $T_0$ in the final stage and $T_0'$ in the "shadow" stage, will be dimensioned with a successively greater current capability, noting that relatively larger currents must be absorbed by the upper switches than the bottom switches. That is, the transistor switches in respectively different ones of the strings within the same controlling switching portion can be dimensioned to have either the same or different transfer capabilities, also.

In those situations where different sized transistors may be used from top to bottom, such as with regard to FIGS. 1 and 2 of the drawings or, for that matter, with regard to any of the disclosed embodiments, different sized transistors from left to right would not be much of a burden since one could simply design differing stocks of transistors or, for that matter, maintain a single standard size of transistors to meet the most extreme needs, i.e., having maximum current transfer capabilities corresponding to that which will be needed, for example, by those transistor switches in the first or initial stage.

With regard to achieving an improved circuit response in terms of reducing errors in the output associated with subthreshold current leakage, especially at the Vgs=0 biasing, as one example discussed earlier, there are several drawbacks that must be considered, also. Namely, a substantially accurate shut OFF or turn OFF of the final circuit is being achieved at the sacrifice of increased circuit area, as well as at the expense of increased circuit power requirements. Using the embodiment in FIG. 1 of the invention as an example, it is noted that the shadow circuit stage/final circuit stage arrangement includes twice the amount of area that would be required of the original circuit (the inventors found the original circuit, in FIG. 7, to be impractical and, therefore, undesirable in terms of todays needs, as discussed earlier). Also, regarding the increased circuit power requirements, it is noted, also, the embodiment according to FIG. 1 of the present invention includes two circuits operating simultaneously which leads to increased circuit power requirements or, conversely, which raises the lower limit of the power requirements of the circuitry. Accordingly, more power is required to operate two stages than a single such stage. These drawbacks notwithstanding, the present inventors consider that such sacrifices are minor when considering the improvement achieved in terms of reducing error in the output resulting from the OFF cycle of the transistor switches. Also, the ability to add additional stages for the purpose of reducing the error to the Nth degree and, therefore, conform the reduction of subthreshold conduction to be commensurate with the improvements in terms of future scale-downs achieved in semiconductor fabrication techniques and low-bias current/power requirements, will make these drawbacks more than acceptable. Thus, the inventors consider that such sacrifices may be necessary, especially, when it comes to future generations of circuits, to which the present invention would also be applicable. That is, as circuit densities become greater and greater and as the logical voltage values fall, the subthreshold leakage currents will become more and more of a problem. However, through the facility of adding additional stages, errors due to such leakage currents can be correspondingly reduced even further. Also, limits on heat dissipation techniques may eventually be reached, such that the brute force method of raising circuit logical voltage/current levels will no longer be possible, i.e., generated heat will not be able to be simply dissipated from the extremely dense circuit which may cause circuit melt-down.

Although the present invention has been described with reference to a number of illustrated embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A multi-stage assembly, comprising:

a plurality of stages which are successively arranged, beginning with a first stage and ending with a final stage, each including a controllable circuit portion and a controlling switching portion coupled thereto, wherein the controlling switching portion of each stage includes one or more ON/OFF switches, a first end of each ON/OFF switch of each said controlling switching portion being coupled to a different node of said controllable circuit portion of a corresponding stage and being coupled, respectively, to a second end of a corresponding switch in an adjacent succeeding stage so as to form one or more selectively actuated strings of series-coupled switches, all switches in each string being ON and OFF substantially simultaneously, wherein said one or more strings are coupled at front ends thereof to different nodes of said controllable circuit portion of said final stage and are coupled at tail ends thereof to a first supply terminal, and wherein said controllable circuit portions are coupled to a second, different supply terminal.

2. A multi-stage assembly according to claim 1, wherein each said ON/OFF switch includes a transistor switch having a controlled main current path and a control terminal, the main current path of each said transistor switch forms a part of each string of series-coupled ON/OFF switches, and the control terminals of all transistor switches of said each string of series-coupled ON/OFF switches are coupled to receive a common control signal.

3. A multi-stage assembly according to claim 1, wherein the controllable circuit portions in all of said stages are substantial duplicates of each other, and wherein an output of the multi-stage assembly is taken at a node of said controllable circuit portion of said final stage other than nodes to which the front ends of said one or more strings are coupled.

4. A multi-stage assembly according to claim 3, wherein said plurality of stages are circuits in which the controllable circuit portions thereof include controllable impedances, respectively.

5. A multi-stage assembly according to claim 1, wherein said plurality of stages are programmable impedance circuits, respectively.

6. A multi-stage assembly according to claim 1, wherein said plurality of stages are circuits in which the controllable circuit portions thereof include controllable impedances, respectively.

7. A multi-stage reconfigurable circuit, comprising:

a plurality of stages, each including a controllable portion and a controlling portion coupled thereto, wherein each controlling portion includes a plurality of ON/OFF switches and the controlling portions of all stages are coupled in series, beginning with a first stage and ending with a final stage, an output of said circuit being taken at a node of the controllable portion of said final stage, and wherein first ends of different ones of said plurality of ON/OFF switches of each controlling portion are coupled to different circuit nodes of said controllable portion of a corresponding stage, the first ends of said plurality of switches of said controlling portion of the first stage through the next-to-last stage being coupled to second ends of corresponding switches of the second through the last stages, respectively, thereby to form a plurality of strings of series-coupled ON/OFF switches, said plurality of strings all have front ends coupled to different nodes of the controllable portion of said final stage, other than the output node thereof, and tail ends commonly coupled to a first supply terminal, a second supply terminal being coupled to the controllable portions of said stages, all switches in an individual string being ON and OFF substantially simultaneously.

8. A multi-stage reconfigurable circuit according to claim 7, wherein the controllable portions of said parallel stages include a substantially same controllable impedance, respectively, the impedance values of the controllable impedances of all said controllable portions being altered through selective actuation of said strings of series-coupled switches.

9. A multi-stage reconfigurable circuit according to claim 8, wherein all said controllable impedances are substantially simultaneously altered through selective actuation of said strings of series-coupled switches.

10. A multi-stage reconfigurable circuit according to claim 8,
wherein each said controllable impedance is a programmable impedance ladder.

11. A multi-stage reconfigurable circuit according to claim 8,
wherein each said controllable impedance is a programmable resistor ladder.

12. A multi-stage reconfigurable circuit according to claim 7,
wherein each said ON/OFF switch includes a transistor switch having a controlled main current path and a control terminal, the main current path of each transistor switch forms a part of each string of said series-coupled ON/OFF switches, and the control terminals of the transistor switches of said string of series-coupled ON/OFF switches are coupled to receive a common control signal.

13. A multi-stage reconfigurable circuit according to claim 12,
wherein each transistor switch includes a field-effect transistor (FET) having a control gate electrode and a source-to-drain main current path.

14. A multi-stage reconfigurable circuit according to claim 13,
wherein each FET is an insulated-gate field-effect transistor.

15. A multi-stage reconfigurable circuit according to claim 12,
wherein each transistor switch includes a CMOS circuit.

16. A multi-stage reconfigurable circuit according to claim 13,
wherein each FET has either an n-channel or p-channel conductivity.

17. A multi-stage reconfigurable circuit according to claim 12,
wherein the first through the next-to-last stages are disposed to reduce error in the output due to leakage current flow, during OFF states, of said switching transistors in the controlling portion of said final stage.

18. A multi-stage reconfigurable circuit according to claim 7,
wherein said circuit includes a biasing network for an analog circuit.

19. A biasing network, for an analog circuit, comprising:
at least three stages, each including a controllable impedance portion and a controlling switching portion coupled thereto,
wherein the controlling switching portions of all stages are coupled in series, beginning with a first stage and ending with a final stage, said controlling switching portion of each stage including a plurality of transistor switches, each transistor switch having a control terminal, coupled to receive an ON/OFF control signal, and first and second main terminals between which a main current path is provided, an output of said biasing network being taken at a node of the impedance portion of said final stage, and
wherein the first main terminals of different ones of said plurality of transistor switches of said controlling portion in each stage are coupled to different nodes of said controllable impedance of a corresponding stage, the first main terminal of all transistor switches of said controlling switching portion of said first stage through the next-to-last stage being coupled to the second main terminal of corresponding transistor switches of the second stage through said last stage, respectively, thereby to form a plurality of strings of series-coupled transistor switches, the strings being coupled, respectively, at front ends thereof to different nodes of the impedance portion of said final stage, other than the output node thereof, and having tail ends commonly coupled to a first power terminal, a second power terminal being coupled to each of the controllable impedance portions, and all transistor switches in an individual string being ON and OFF substantially simultaneously.

20. A biasing network, for an analog circuit, according to claim 19,
wherein one of said first and second power terminals is applied with a reference potential and the other power terminal is applied with DC voltage.

21. A biasing network, for an analog circuit, according to claim 19,
wherein said first power terminal is applied with a reference potential and said second power terminal is applied with AC voltage.

22. A biasing network, for an analog circuit, according to claim 19,
wherein the controllable impedance portion of all of said stages are substantial duplicates of each other, impedance value of all impedance portions are substantially simultaneously altered through selective actuation of ones of said strings of series-coupled transistor switches.

23. A biasing network, for an analog circuit, according to claim 22,
wherein each controllable impedance portion includes a programmable impedance ladder.

24. A biasing network, for an analog circuit, according to claim 22,
wherein each controllable impedance portion includes a programmable resistor ladder.

25. A biasing network, for an analog circuit, according to claim 19,
wherein each said transistor switch includes a FET.

26. A biasing network, for an analog circuit, according to claim 25,
wherein said FET is an IGFET.

27. A biasing network, for an analog circuit, according to claim 19,
wherein each said transistor switch includes a CMOS circuit.

28. A biasing network, for an analog circuit, according to claim 19,
wherein all of said strings include the same number of transistor switches.

29. A biasing network, for an analog circuit, according to claim 19,
wherein the first through the next-to-last stages are disposed to reduce error in the output due to leakage current flow, during OFF states, of said individual switching transistors in the controlling portion of said final stage.

30. A biasing network, for an analog circuit, according to claim 19,
wherein the transistor switches in each string are dimensioned, respectively, to have either the same current transfer capability or have a successively increased current transfer capability as the distances thereof away from said final stage is increased, and wherein corresponding transistor switches in respectively different strings are dimensioned to have either the same or different current transfer capabilities.

31. A multi-stage assembly, comprising:

a plurality of programmable impedance circuit stages which are successively arranged, beginning with a first stage and ending with a final stage, each including a controllable circuit portion and a controlling switching portion coupled thereto, wherein the controlling switching portion of each stage includes one or more ON/OFF switches, a first end of each ON/OFF switch of each said controlling switching portion being coupled to a different node of said controllable circuit portion of a corresponding stage and being coupled, respectively, to a second end of a corresponding switch in an adjacent succeeding stage so as to form one or more selectively actuated strings of series-coupled switches, all switches in each string being ON and OFF substantially simultaneously.

* * * * *